(12) United States Patent
Suzuki et al.

(10) Patent No.: US 6,885,046 B2
(45) Date of Patent: Apr. 26, 2005

(54) SEMICONDUCTOR INTEGRATED CIRCUIT CONFIGURED TO SUPPLY SUFFICIENT INTERNAL CURRENT

(75) Inventors: Kenji Suzuki, Kawasaki (JP); Toru Osajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/058,005

(22) Filed: Jan. 29, 2002

(65) Prior Publication Data

US 2002/0140002 A1 Oct. 3, 2002

(30) Foreign Application Priority Data

Mar. 30, 2001 (JP) .................................... 2001-102174

(51) Int. Cl.[7] ............................................. H01L 27/10
(52) U.S. Cl. ....................... 257/207; 257/203; 257/208; 257/786; 257/210; 257/691; 257/773; 257/211; 257/202; 257/781; 257/776
(58) Field of Search ................................ 257/207, 203, 257/208, 786, 210, 691, 773, 211, 202, 781, 776

(56) References Cited

U.S. PATENT DOCUMENTS 6,242,814 B1 * 6/2001 Bassett ........................ 257/786
6,246,122 B1 * 6/2001 Lin ............................ 257/786

FOREIGN PATENT DOCUMENTS

JP          9-199601          7/1997

OTHER PUBLICATIONS

B. Prince, et al. "Semiconductor Memories", pp. 269.
Taiwan Office Action of Application No. 091101898 issued Feb. 18, 2003 with English Translation.

* cited by examiner

*Primary Examiner*—Eddie Lee
*Assistant Examiner*—Junghwa Im
(74) *Attorney, Agent, or Firm*—Arent Fox, PLLC

(57) ABSTRACT

A semiconductor integrated circuit includes pads, a first power supply I/O cell which is connected to an external pin through a corresponding one of the pads, and a second power supply I/O cell which is not connected to an external pin through a corresponding one of the pads, but receives power supply from the first power supply I/O cell.

1 Claim, 6 Drawing Sheets

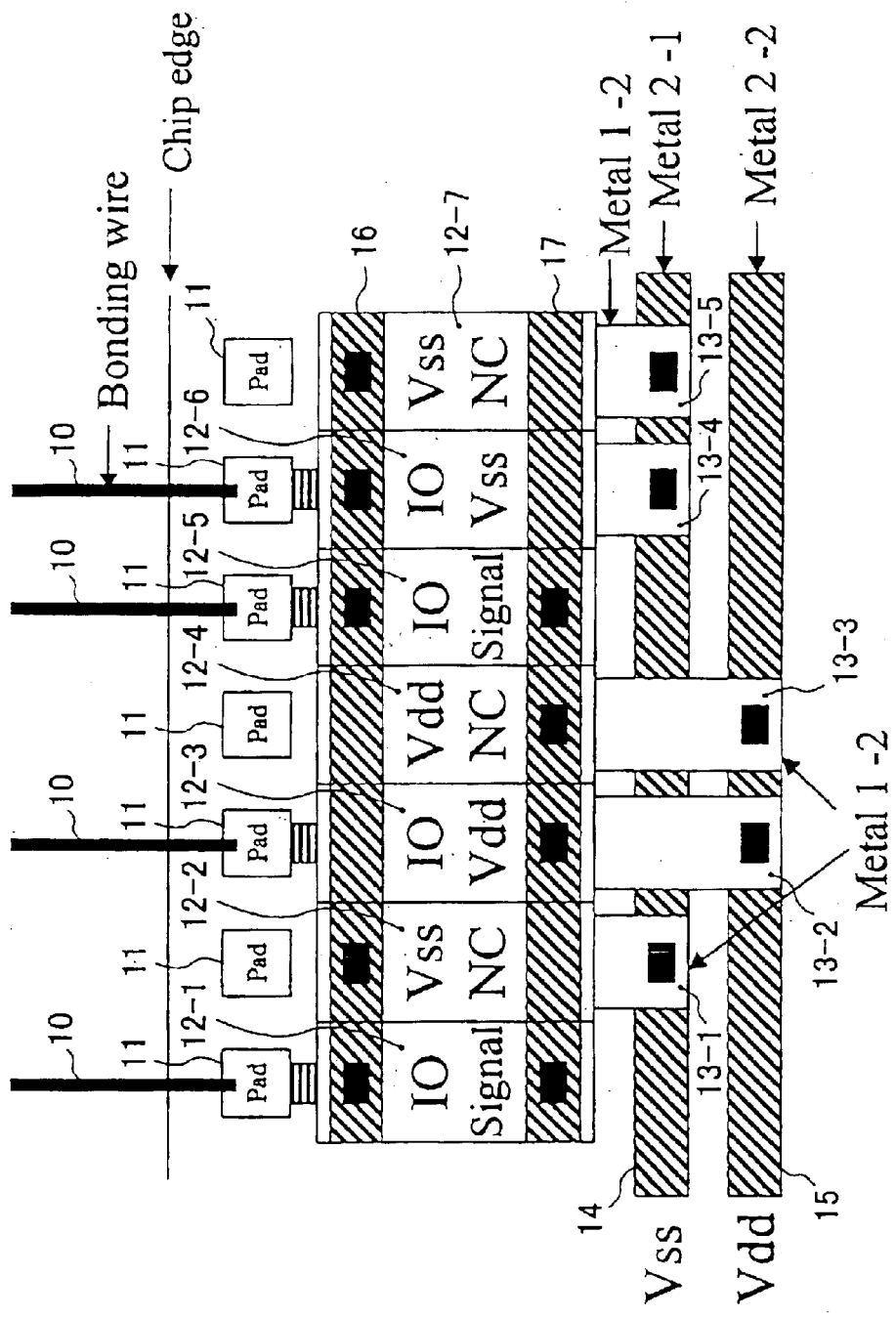

SEMICONDUCTOR INTEGRATED CIRCUIT CONFIGURED TO SUPPLY SUFFICIENT INTERNAL CURRENT

BACKGROUND OF THE INVENTION

1. Field of the Invention

The present invention generally relates to semiconductor integrated circuits, and particularly to a semiconductor integrated circuit that has power supply lines provided in cell areas inside the chip.

2. Description of the Related Art

In semiconductor integrated circuits, the power supply voltage is provided from an external pin to an internal cell through a lead frame, a bonding wire, a pad, and a power supply I/O. The power supply I/O is an area section comprised of an aluminum wire that exists between a pad and a main power supply line connected to the internal cell, and that is provided for each pad on which a bonding wire is connected. The power supply I/O may be equipped with a circuit for preventing damage caused by static charge. Connection between the pad and the power supply I/O is provided through a multi-layered wire structure. Between the power supply I/O and the main power supply line connected to the internal cell area, on the other hand, a connection is generally provided through a single layer structure, and is implemented by using a narrower wire width than the power supply I/O.

As the number of pins in semiconductor integrated circuits increases, the pitch of bonding pads becomes increasingly short. As a result of this, the width of a power supply I/O cell (i.e., a section where the power supply I/O is situated) becomes increasingly narrow.

Under such circumstances, a wire line leading from a power supply I/O cell to a main power supply line becomes narrow, resulting in an inability to support a sufficient current running through the wire line. The amount of current supplied to the internal cell area thus becomes insufficient.

Accordingly, the present invention provides a semiconductor integrated circuit which can supply a sufficient amount of electric current to internal cell areas.

SUMMARY OF THE INVENTION

It is a general object of the present invention to provide a semiconductor integrated circuit that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor integrated circuit particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor integrated circuit that includes pads, a first power supply I/O cell which is connected to an external pin through a corresponding one of the pads, and a second power supply I/O cell which is not connected to an external pin through a corresponding one of the pads, but receives power supply from the first power supply I/O cell.

Further, the semiconductor integrated circuit as described above further includes an internal cell, a power supply line which provides power supply to the internal cell, a line which connects between the first power supply I/O cell and the power supply line, and a line which connects between the second power supply I/O cell and the power supply line.

In the semiconductor integrated circuit as described above, an I/O cell that is not connected to an external source and was not in use is utilized as a power supply I/O cell having no external connection that receives power supply from a power supply I/O cell connected to an external pin. With this provision, the power supply voltage is supplied to an internal main power supply line from the power supply I/O cell that is not connected to an external source as well as from the power supply I/O cell that is connected to an external source. This makes efficient use of areas that were wasted in the layout, and helps to increase the amount of current supplied to the internal cell.

According to another aspect of the present invention, the semiconductor integrated circuit as described above is such that the second power supply I/O cell is not connected to the corresponding one of pads that corresponds to the second power supply I/O cell.

In the semiconductor integrated circuit described above, the power supply I/O cell having no external connection receives power supply from the power supply I/O cell having a direct external connection, and, thus, does not need to be connected to the corresponding one of the pads. An excess connection line for such a pad can thus be eliminated.

According to another aspect of the present invention, a method of designing a power supply layout of a semiconductor integrated circuit includes the steps of identifying an unused I/O cell having no external connection, and assigning the I/O cell to be a power supply I/O cell having no direct external connection.

In the method as described above, an I/O cell that is not connected to an external source and was not in use is connected to a power supply I/O cell connected to an external pin, and is thus utilized as a power supply I/O cell having no external connection. This makes efficient use of areas that were wasted in the layout, and helps to increase the amount of current supplied to the internal cell.

Other objects and further features of the present invention will be apparent from the following detailed description when read in conjunction with the accompanying drawings.

BRIEF DESCRIPTION OF THE DRAWINGS

FIG. 7 is an illustrative drawing showing a configuration around power supply I/O cells of a semiconductor integrated circuit.

DESCRIPTION OF THE PREFERRED EMBODIMENTS

In the following, embodiments of the present invention will be described with reference to the accompanying drawings.

Figure 1:
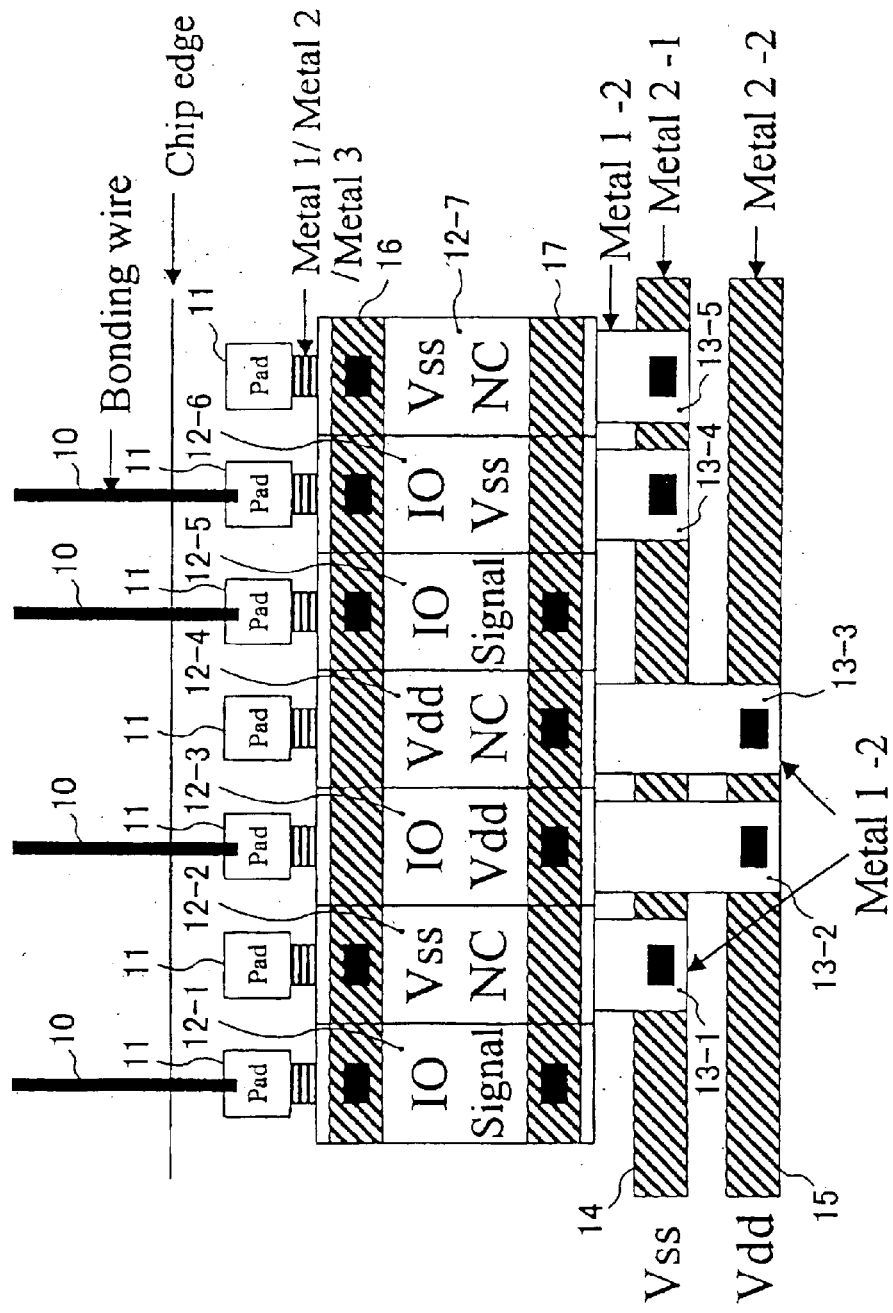
FIG. 1 is an illustrative drawing for explaining power supply according to the present invention.

FIG. 1 is an illustrative drawing for explaining power supply according to the present invention. FIG. 1 shows a configuration around a power supply I/O cell of a semiconductor integrated circuit.

In FIG. 1, bonding wires 10 are connected to pads 11. The pads 11 are connected to respective I/O cells 12-1 through 12-7. This connection is made by using the first through third layers Metal1 through Metal3. The I/O cells 12-1 through 12-7 include an I/O cell IOSignal for conveying an I/O signal, a ground-potential power supply I/O cell VssNC that utilizes un unused I/O cell as a power supply I/O, a power-supply-potential power supply I/O cell IOVdd, a power-supply-potential power supply I/O cell VddNC that utilizes an unused I/O cell as a power supply I/O, an I/O cell IOSignal for conveying an I/O signal, a ground-potential power supply I/O cell IOVss, and a ground-potential power supply I/O cell VssNC that utilizes un unused I/O cell as a power supply I/O. Here, the notation "NC" indicates an I/O cell that has been originally unused.

In the present invention, the I/O cells 12-2, 12-4, and 12-7 that are not connected to external pins through the pads 11 and were not in use are utilized as power supply I/Os. For example, the I/O cell 12-2 that is not connected to an external pin and was not in use is connected to the ground-potential power supply I/O cell 12-6 connected to an external pin, and is now used as the ground-potential power supply I/O cell VssNC that is not connected to an external pin. The power supply I/O cell 12-2 that is not connected to an external pin receives a ground potential from an external source through the ground-potential power supply I/O cell 12-6 that is connected to an external pin. The power supply I/O cell 12-2 supplies the ground potential through a wire line 13-1 to a main power supply line 14 connected to internal cells.

By the same token, the power-supply-potential power supply I/O cell 12-4 that is not connected to an external pin receives a power-supply potential from an external source through the power-supply-potential power supply I/O cell 12-3 that is connected to an external pin. The power-supply-potential power supply I/O cell 12-4 then supplies the power supply potential through a wire line 13-3 to a main power supply line 15 connected to internal cells. The ground-potential power supply I/O cell 12-7 that is not connected to an external pin receives the ground potential from the external source through the ground-potential power supply I/O cell 12-6 that is connected to an external pin. The ground-potential power supply I/O cell 12-7 then supplies the power supply potential through a wire line 13-5 to the main power supply line 14 connected to the internal cells. The power supply I/O cells 12-3 and 12-6 that are connected to the external source supply the power-supply potential and the ground potential to the main power supply lines 14 and 15 through wire lines 13-2 and 13-4, respectively. Connections between the I/O cells 12-1 through 12-7 are achieved by use of wire lines 16 and 17.

As described above, the present invention utilizes an I/O cell that is not connected to an external source and was not in use, by connecting such an I/O cell to a power supply I/O cell that is connected to an external source. With this provision, the power supply voltage is supplied to an internal main power supply line from the power supply I/O cell that is not connected to an external source as well as from the power supply I/O cell that is connected to an external source. This makes efficient use of areas that were wasted in the layout, and helps to increase an inefficient amount of current supplied to the internal cells.

Figure 2:
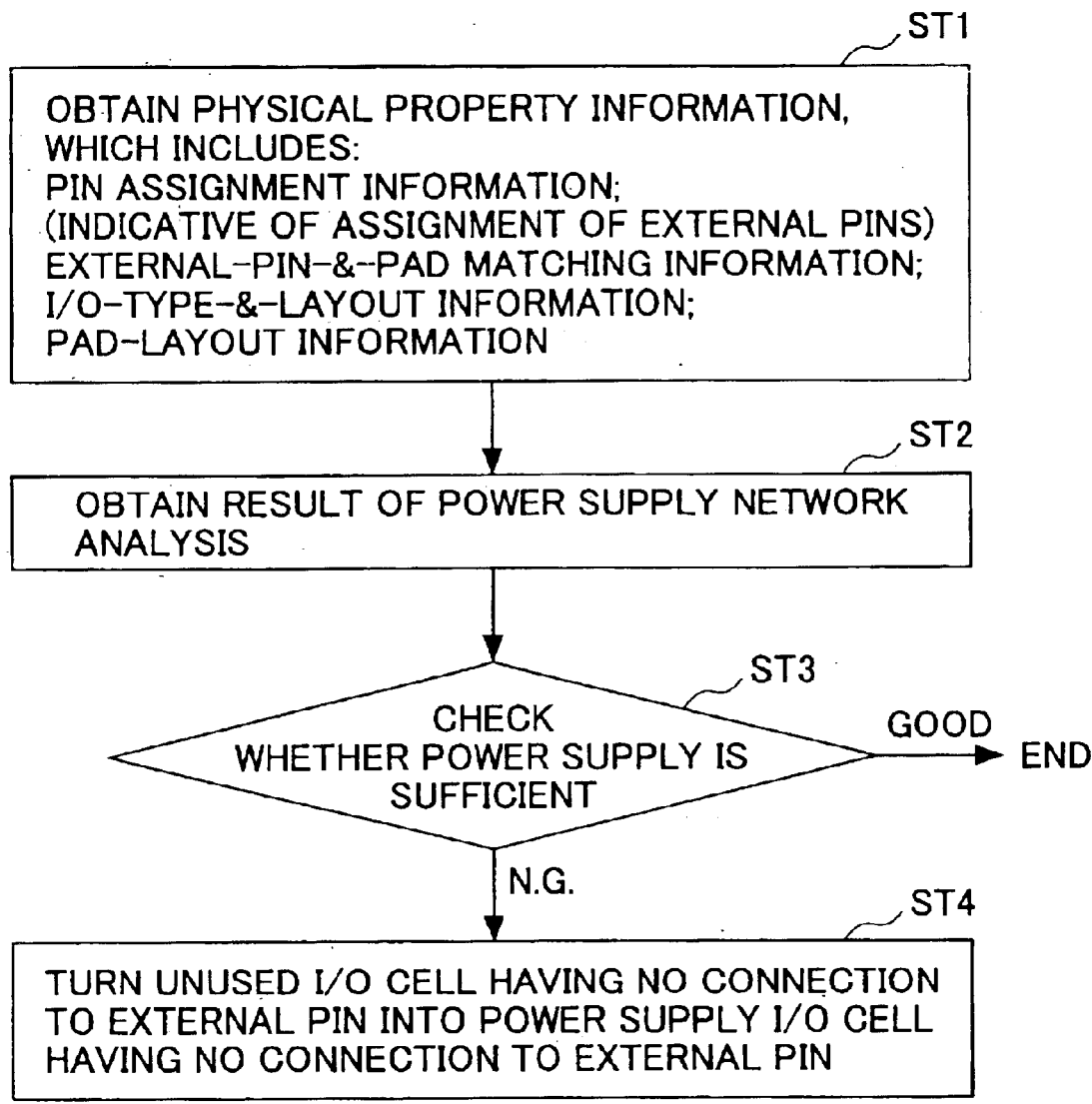
FIG. 2 is a flowchart of a process of allocating a power supply I/O cell that is not connected to an external source according to the present invention.

FIG. 2 is a flowchart of a process of allocating a power supply I/O cell that is not connected to an external source according to the present invention. This process is performed by a CAD (computer aided design) system as part of a layout design process.

At step ST1, physical property information about a layout is obtained. The physical property information includes pin assignment information indicative of the assignment of external pins to power supply sources, data signals, and control signals, etc, external-pin-&-pad matching information indicative of mating relations between the external pins and pads (e.g., the pads 11 of FIG. 1), I/O-type-&-layout information indicative of types and layouts of I/O cells (e.g., the I/O cells 12-1 through 12-7), pad-layout information indicative of the layout of pads, etc.

At step ST2, results of a power supply network analysis are obtained. In detail, the amount of power supply at an initial stage is calculated based on the physical property information obtained at step ST1, and the amount of a power supply current necessary for each internal cell area inside the chip is computed based on data of a network structure such as a resistor network including wire lines for power supply and ground potential.

At step ST3, a check is made as to whether the amount of power supply is sufficient. Namely, the amount of power supply at the initial stage computed at step ST2 is compared with the amount of power supply currents necessary for the internal cell areas inside the chip, thereby making a check as to whether the amount of power supply at the initial stage is sufficient. If the amount of a power supply current is sufficient, the procedure comes to an end based on the premise that there is no problem with the power supply network. If the amount of a power supply current is insufficient, the procedure goes to step ST4.

When the amount of power supply for the internal cell areas is insufficient, at step ST4, an unused I/O cell that is not connected to an external pin is turned into a power supply I/O cell that is not connected to an external pin. This is done at a portion where the amount of a power supply current is insufficient. In detail, provision is made in the CAD layout design to utilize an unused I/O cell having no connection to an external pin as a power supply I/O cell that is not connected to an external pin, to establish a line that supplies power supply to the power supply I/O cell that is not connected to an external pin, and to lay out a line from the power supply I/O cell having no connection with an external pin to a main power supply line connected to internal cell areas.

With this, the procedure comes to an end.

In this manner, the amount of necessary power supply is computed, and an unused I/O cell having no connection to an external pin is turned into a power supply I/O cell having no connection to an external pin, thereby securing a necessary amount of power supply.

Figure 3:
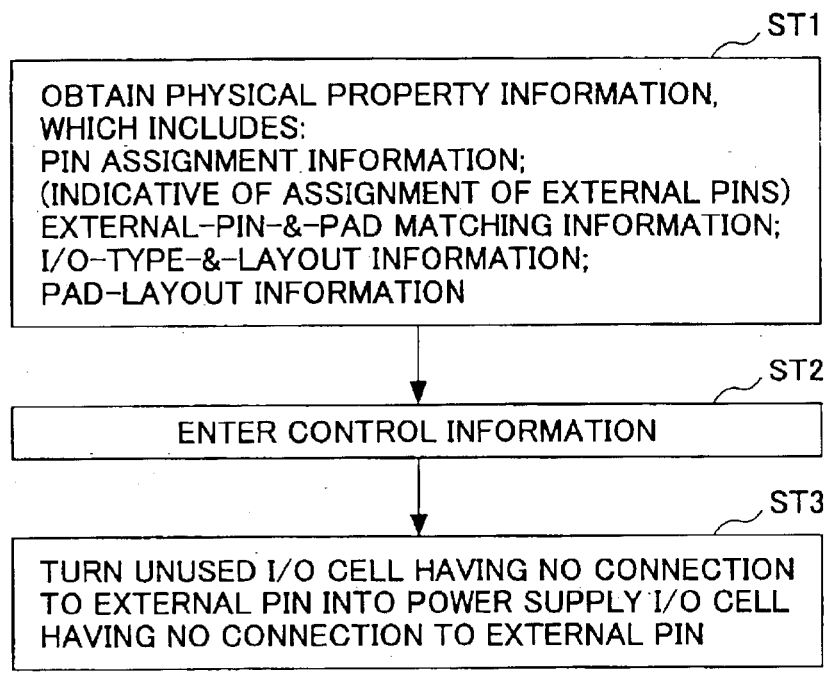
FIG. 3 is a flowchart showing another example of a process of allocating a power supply I/O cell that is not connected to an external pin according to the present invention.

FIG. 3 is a flowchart showing another example of a process of allocating a power supply I/O cell that is not connected to an external pin according to the present invention. This process is performed by a CAD (computer aided design) system as part of a layout design process.

At step ST1, physical property information about a layout is obtained. The physical property information includes pin assignment information indicative of the assignment of external pins to power supply sources, data signals, and control signals, etc, external-pin-&-pad matching information indicative of mating relations between the external pins and pads (e.g., the pads 11 of FIG. 1), I/O-type-&-layout information indicative of types and layouts of I/O cells (e.g., the I/O cells 12-1 through 12-7), pad-layout information indicative of the layout of pads, etc.

At step ST2, control information is input. The control information includes information indicative of the minimum number of necessary power supply sources (i.e., the amount of power supply), information indicative of the number of unused cells that are turned into power supply source, information indicative of the amount of power supply necessary for internal macros, information indicative of the amount of necessary power supply calculated based on chip size and gate size, etc. For example, the information indicative of the amount of power supply necessary for internal macros may specify that there is a special macro consuming a large amount of power, and that use of this macro requires an additional x lines of power supply. The control information may be provided as a library or a control card of a CAD system.

At step ST3, an unused I/O cell having no connection with an external pin is turned into a power supply I/O cell having no connection with an external pin at a portion where the amount of power supply is insufficient. Namely, an unused I/O cell having no connection to an external pin is turned into a power supply I/O cell having no connection to an external pin based on the control information obtained at step ST2 and the physical property information obtained at step ST1. Further, a line for supplying power to the power supply I/O cell having no connection to an external pin is provided, and a line is laid out from the power supply I/O cell having no connection to an external pin to a main power supply line connected to internal cell areas.

With this, the procedure comes to an end.

In this manner, the control information indicative of the number of necessary power supply sources and the like is prepared beforehand, and is provided as a library or a control card of a CAD system. With this provision, an unused I/O cell having no connection with an external pin is turned into a power supply I/O cell having no connection with an external pin, without computing the amount of power supply based on the analysis of a power supply network.

Figure 4:
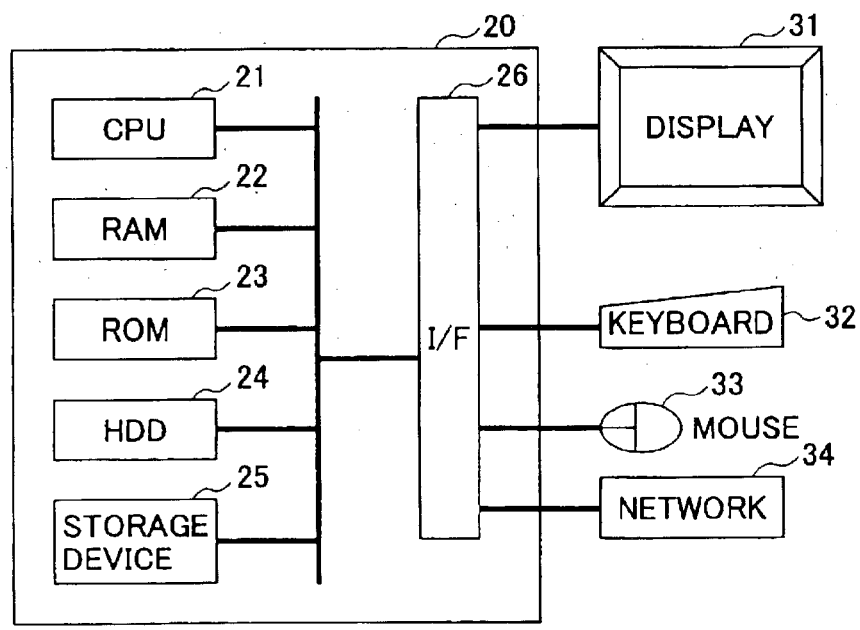
FIG. 4 is a block diagram showing an example of a CAD system for performing the process of allocating a power supply I/O cell having no external connection according to the present invention.

FIG. 4 is a block diagram showing an example of a CAD system for performing the process of allocating a power supply I/O cell having no external connection according to the present invention.

As shown in FIG. 4, the CAD system for performing the process of allocating a power supply I/O cell having no external connection according to the present invention is implemented by use of a computer such as an engineering workstation.

The CAD system of FIG. 4 includes a computer 20, and further includes a display apparatus 31, a keyboard 32, a mouse 33, and a network communication apparatus 34 connected to the computer 20. The keyboard 32 and the mouse 33 together make up an input apparatus. The computer 20 includes a CPU 21, a RAM 22, a ROM 23, a hard drive HDD 24, an exchangeable-medium storage device 25, and an interface 26.

The keyboard 32 and the mouse 33 provide a user interface, and receive various commands for operating the computer 20 and user responses entered in response to prompt. The display apparatus 31 presents the results of processing or the like obtained by the computer 20, and displays various data that make it possible to interact with the user. The network communication apparatus 34 is provided for the purpose of communicating with a remote site, and is comprised of a modem, a network interface, or the like.

The method of allocating a power supply I/O cell having no external connection according to the present invention is provided as a computer program executable by the computer 20. This computer program is stored in a memory medium mountable to the exchangeable-medium storage device 25, and is loaded to the RAM 22 or to the HDD 24 from the memory medium through the exchangeable-medium storage device 25. Alternatively, the computer program is stored in a memory medium at a remote site (not shown), and is loaded to the RAM 22 or to the HDD 24 from this memory medium through the network communication apparatus 34 and the interface 26. Alternatively, the computer 20 may be provided with this computer program installed in the HDD 24.

The CPU 21 uses an available space of the RAM 22 as a work area to execute the program loaded to the RAM 22, and proceeds by interacting with the user as necessary. The ROM 23 stores control programs for controlling basic operations of the computer 20.

Figure 5:
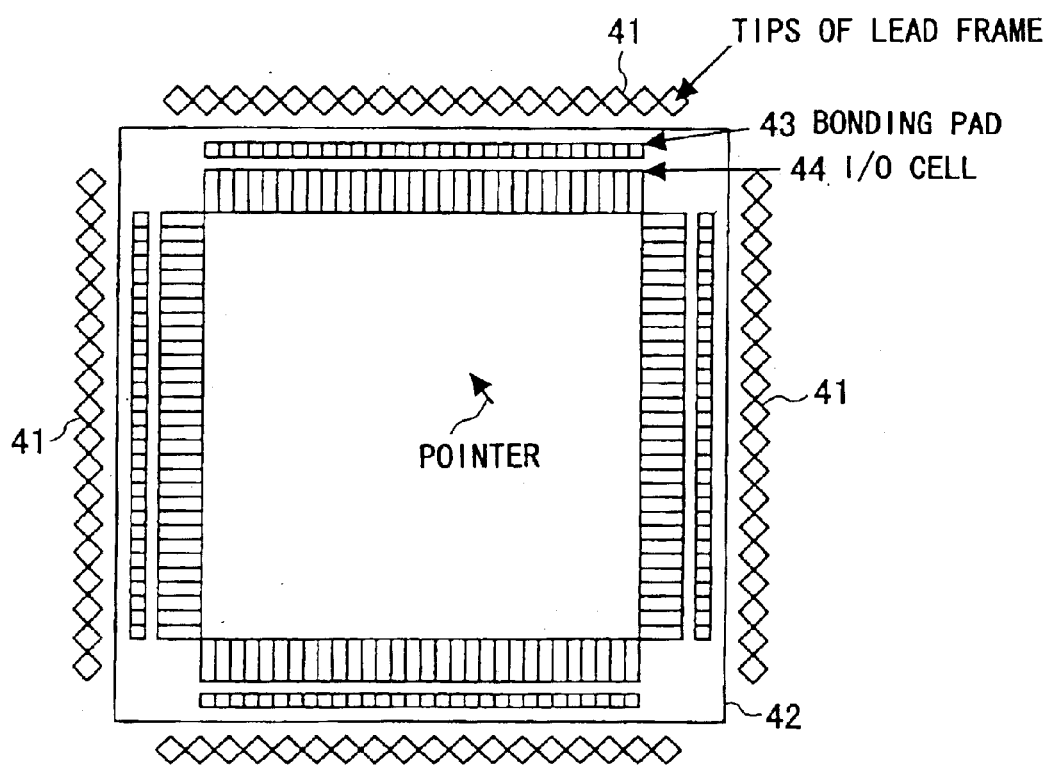
FIG. 5 is an illustrative drawing showing an illustration presented on a screen display of a display apparatus of the CAD system shown in FIG. 4.

FIG. 5 is an illustrative drawing showing an illustration presented on a screen display of the display apparatus 31 of the CAD system shown in FIG. 4. In the process of allocating a power supply I/O cell having no external connection according to the present invention, the drawing of a chip 42 is presented on the display screen. With this drawing of the chip 42, bonding pads 43 and I/O cells 44 provided on the chip are also presented. Further, tips of lead frames 41 are shown around the chip 42.

A pointer 50 is also shown on the screen. The pointer 50 is operated by a pointing device such as the mouse 33 of the CAD system shown in FIG. 4. In the process of allocating a power supply I/O cell having no external connection according to the present invention, a pointing device such as the mouse 33 is operated to move the pointer 50 around, thereby selecting an unused I/O cell having no external connection and turning it into a power supply I/O cell having no external connection. This process is carried out when the user selects an unused I/O cell at a position where the amount of a power supply current is insufficient at step ST4 of FIG. 2 or at step ST3 of FIG. 3.

When a cell is to be selected by the pointer 50 based on the pointer device, a bonding pad 43 may be selected by the pointer 50, rather than selecting an I/O cell 44 by the pointer 50. In this manner, all that is required is that the user of the CAD system can select an unused I/O cell having no external connection with ease, and a method of selection is not limited to any particular method.

Figures 6A, 6B:
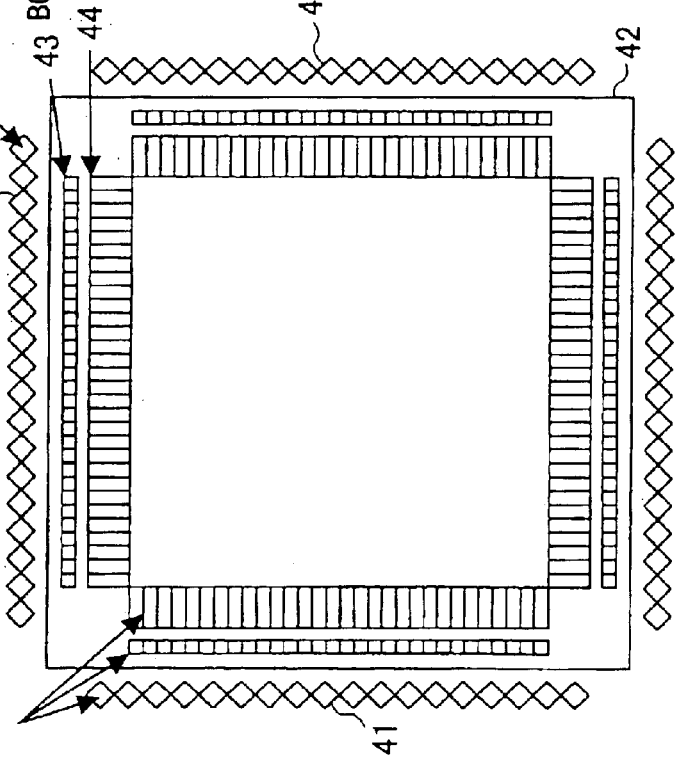
FIG. 6A is an illustrative drawing showing an example of an illustration presented on the screen display of the CAD system in the process of allocating a power supply I/O cell having no external connection according to the present invention.
FIG. 6B is a table that shows matching relations between external pins, pads, and I/O cells.

FIG. 6A is an illustrative drawing showing an example of an illustration presented on the screen display of the CAD system in the process of allocating a power supply I/O cell having no external connection according to the present invention.

FIG. 6A shows an example of a screen display shown on the display apparatus 31 of the CAD system of FIG. 4. In the process of allocating a power supply I/O cell having no external connection according to the present invention, an illustration of the chip 42 is presented on the display screen. With this drawing of the chip 42, the bonding pads 43 and the I/O cells 44 provided on the chip are also presented. Further, the tips of lead frames 41 are shown around the chip 42.

In this example, numbers are assigned to the lead frames 41, the bonding pad 43, and the I/O cells 44 in an ascending order in the counterclockwise direction by starting from the top left corner of the chip 42. FIG. 6B is a table that shows matching relations between the external pins (corresponding to the lead frames 41), the pads, and the I/O cells, which are numbered as described above. An I/O cell numbered as "1", for example, has a matching relation with a pad of number "1" and an external pin of number "1". An I/O cell numbered as "2" corresponds to a pad of number "2", but has no matching external pin. That is, the I/O cell numbered as "2" is an I/O cell having no external connection. If this I/O cell having no external connection is unused, it can be used as a power supply I/O cell having no external connection as necessary.

At step ST4 of FIG. 2 or at step ST3 of FIG. 3, it may be ascertained that the amount of a power supply current is insufficient. Upon such determination, the use selects an I/O cell number at a relevant portion, thereby selecting an unused I/O cell having no external connection and turning it into a power supply I/O cell having no external connection. When an unused I/O cell having no external connection is to be selected, an I/O cell number may not have to be identified, but a pad number may be identified to make the selection. In this manner, all that is required is that the user of the CAD system can select an unused I/O cell having no external connection with ease, and a method of selection is not limited to any particular method.

FIG. 7 is an illustrative drawing showing a configuration around power supply I/O cells of a semiconductor integrated circuit.

In FIG. 7, the bonding wires 10 are connected to the pads 11. The pads 11 are connected to the respective I/O cells 12-1 through 12-7. This connection is made by using the first through third layers Metal1 through Metal3. The I/O cells 12-1 through 12-7 include an I/O cell IOSignal for conveying an I/O signal, a ground-potential power supply I/O cell VssNC that utilizes un unused I/O cell as a power supply I/O, a power-supply-potential power supply I/O cell IOVdd, a power-supply-potential power supply I/O cell VddNC that utilizes an unused I/O cell as a power supply I/O, an I/O cell IOSignal for conveying an I/O signal, a ground-potential power supply I/O cell IOVss, and a ground-potential power supply I/O cell VssNC that utilizes un unused I/O cell as a power supply I/O. Here, the notation "NC" indicates an I/O cell that has been originally unused.

In the same manner as in FIG. 1, the I/O cells 12-2, 12-4, and 12-7 that have no external connections and were not in use are utilized as power supply I/Os in FIG. 7. For example, the unused I/O cell 12-2 having no external connection is connected to the ground-potential power supply I/O cell 12-6 connected to an external pin, and is now used as the ground-potential power supply I/O cell VssNC that is not connected to an external pin. The power supply I/O cell 12-2 that is not connected to an external pin receives a ground potential from an external source through the ground-potential power supply I/O cell 12-6 that is connected to an external pin. The power supply I/O cell 12-2 supplies the ground potential through the wire line 13-1 to the main power supply line 14 connected to internal cells. The same applies in the case of the power-supply-potential power supply I/O cell 12-4 having no connection to an external pin and the ground-potential power supply I/O cell 12-7 having no connection with an external pin.

The configuration of FIG. 7 is almost the same as the configuration of FIG. 1, except for that the I/O cells 12-2, 12-4, and 12-7 used as power supply I/O cells having no external connections are not connected to the pads 11. The power supply I/O cells 12-2, 12-4, and 12-7 having no external connection receive power from one of the power supply I/O cells 12-3 and 12-6 that are directly connected to external sources, so that there is no need for them to be connected to the pads 11. Accordingly, lines connected to the pads 11 may be removed from the layout with respect to I/O cells that are identified during a layout design process as power supply I/O cells having no external connection.

Further, the present invention is not limited to these embodiments, but various variations and modifications may be made without departing from the scope of the present invention.

The present application is based on Japanese priority application No. 2001-102174 filed on Mar. 30, 2001, with the Japanese Patent Office, the entire contents of which are hereby incorporated by reference.

What is claimed is:

1. A semiconductor integrated circuit, comprising:

a first power supply I/O cell;

a wire line which is connected to said first power supply I/O cell;

a second power supply I/O cell which is connected to said wire line to receive power supply from said first power supply I/O cell;

an internal cell; and a power supply line which provides power supply to said internal cell, said first power supply I/O cell and said second power supply I/O cell being each connected to said power supply line;

pads which include a first pad and a second pad;

wherein said first pad is provided corresponding to said first power supply I/O cell, wherein said second pad is provided corresponding to said second power supply I/O cell and is different from said first pad, wherein said first pad is connected to said first power supply I/O and is connected to at least one external pin, and wherein said second pad is not connected to said second power supply I/O and is not connected to any of the least one external pin.

* * * * *